(12) United States Patent
Anderson et al.

(10) Patent No.: US 7,193,286 B2
(45) Date of Patent: Mar. 20, 2007

(54) RADIAL FIELD GENERATING SELECTION CONDUCTOR DEVICE

(75) Inventors: John M. Anderson, Villa Rica, GA (US); Jian-Gang Zhu, Pittsburgh, PA (US)

(73) Assignee: NVE Corporation, Eden Prairie, MN (US)

( * ) Notice: Subject to any disclaimer, the term of this patent is extended or adjusted under 35 U.S.C. 154(b) by 81 days.

(21) Appl. No.: 11/193,775

(22) Filed: Jul. 29, 2005

(65) Prior Publication Data

US 2006/0022238 A1    Feb. 2, 2006

Related U.S. Application Data

(60) Provisional application No. 60/592,645, filed on Jul. 30, 2004.

(51) Int. Cl.
  *H01L 31/119*  (2006.01)
  *H01L 29/82*   (2006.01)
  *H01L 43/00*   (2006.01)
  *H01L 27/14*   (2006.01)

(52) U.S. Cl. ............... 257/421; 257/428; 257/295

(58) Field of Classification Search .......... 257/295, 257/421–428; 438/3; 365/158
  See application file for complete search history.

(56) References Cited

U.S. PATENT DOCUMENTS 6,063,506 A    5/2000  Andricacos et al.
6,090,710 A    7/2000  Andricacos et al.
6,429,523 B1   8/2002  Andricacos et al.
7,046,546 B1 * 5/2006  Inaba ........................ 365/158
7,119,388 B2 * 10/2006 Yates et al. ................ 257/295
7,126,202 B2 * 10/2006 Huai et al. ................. 257/421

OTHER PUBLICATIONS

Jian-Gang Zhu, Youfeng Zheng and Gary A. Prinz, "Ultrahigh Density Vertical Magnetoresistive Random Access Memory (Invited)", *Journal of Applied Physics*, vol. 87, No. 9, pp. 6668-6673, May 1, 2000.

* cited by examiner

*Primary Examiner*—Cuong Nguyen
(74) *Attorney, Agent, or Firm*—Kinney & Lange, P.A.

(57) ABSTRACT

A ferromagnetic thin-film based array of directed magnetic field generating structures having a plurality of toroidally shaped layer stacks each with a pair of ferromagnetic material layers separated by an intermediate layer of non-magnetic material. Electrical connections are made to opposite sides thereof. A serpentine first side electrical conductor is folded back so as to have parallel branches and together zigzag to cross over each stack on one side thereof. A serpentine second side electrical conductor, also folded back so as to have parallel branches, can be further provided with these branches together zigzagging to cross each stack on an opposite side thereof. These first and second side electrical conductors can be electrically joined to form an array electrical conductor.

18 Claims, 6 Drawing Sheets

RADIAL FIELD GENERATING SELECTION CONDUCTOR DEVICE

CROSS-REFERENCE TO RELATED APPLICATION(S)

This application claims the benefit of Provisional Application No. 60/592,645 filed on Jul. 30, 2004 for "RADIAL FIELD GENERATING SELECTION CONDUCTOR DEVICE".

BACKGROUND OF THE INVENTION

The present invention relates to ferromagnetic thin-film structures exhibiting relatively large magnetoresistive characteristics and, more particularly, to such structures used for the storage and retrieval of digital data, and for the sensing of external magnetic fields.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect", or GMR effect, can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

Typically, such GMR effect based magnetoresistive memory cells are provided as an array thereof in and from which data is stored and retrieved, the array being formed on an insulating layer provided on a substrate containing a monolithic integrated circuit for operating the cells. These memory cells are typically interconnected by sense line interconnections in parallel series strings so that each such string forms a sense line. In addition, cells these strings are typically provided separated by portions of electrically insulating layers from a first set of word lines that extend parallel to one another and perpendicular to the sense lines so that each of these word lines passes under a corresponding sequential set of cells such that each cell in the set is in a different sense line string, and further separated by portions of electrically insulating layers from a second set of word lines each provided parallel to a corresponding sense line usually on a side of the cells opposite that adjacent to the first set of word lines. Alternatively, the word line sets can be perpendicular to one another but on diagonal axes with respect to the sense lines.

These sense lines and word lines together allow coincident current pulses therein to generate coincident magnetic fields thereabout that combine at selected ones of the memory cells where a current activated sense line and current activated word lines cross one another. Data can be stored in such cells when coincident currents generating external magnetic fields are used in the word lines only although such fields can be enhanced by using coincident currents in the appropriate sense lines also. Data sensing currents for retrieving stored data from the cells are established in those cells through the sense lines.

One such digital data memory cell, 5, shown in a top view of a monolithic integrated circuit portion in FIG. 1 utilizes the vertical "giant magnetoresistive effect" in which sense currents through the cell follow a path perpendicular to the planes in which the cell thin-film layers are provided as opposed to the version of the effect described above with currents being parallel to those planes. A cross section view, as marked in FIG. 1, is shown as a resulting layer diagram of that integrated circuit portion in FIG. 2 but with the view there being tilted upward slightly. GMR based cell 5 is fabricated of sequentially deposited multiple thin-film layers to form a stack, 6, thereof that are patterned during such fabrication to each have the shape of a circular disk with a centered circular opening therein. The magnetic material layers in the stack are alternately provided relatively thick (providing relatively harder magnetization) and relatively thin (providing relatively softer magnetization), and the stack is formed of repeats of copper and then a soft magnetic material layer followed by copper and then a hard magnetic material layer. The magnetic material layers are a ferromagnetic alloy of nickel, iron and cobalt, with a composition of Ni(65%)Fe(15%)Co(20%).

Electrical contacts, 7A and 7B, are provided on the top and bottom, respectively, of stack 6 in each cell 5 such that any sense current flows through the cell are established perpendicular to the planes of the cell stack films. A number of such memory cells 5 can be interconnected beginning, for example, with top electrical contact 7A of one cell being interconnected to top electrical contact 7A of a subsequent cell with the interconnection involved also being designated as 7A, and then from bottom contact 7B of this subsequent cell to bottom contact 7B of the next subsequent cell similarly designating the interconnection also as 7B, the result being a series connected string of such cells to form a sense line, 7.

Word lines, 8A, 8B, 8C and 8D, are formed by two pairs of parallel conductors with one pair, having word lines 8A and 8B therein, positioned over the top of interconnected cell stack 6 and the other pair, having word lines 8C and 8D therein, positioned below the bottom of interconnected cell stack 6, respectively, and these pairs of word lines are arranged in those positions to extend orthogonally to each other by pair. Word line currents are typically established in each conductor within a pair having the same magnitude in each but flowing in opposite directions to one another. Such currents in the paired word lines generate magnetic fields encircling them to result in an approximation of radial magnetic fields being established through the corresponding memory cell in having the field due to each line, directed either outward or inward depending on current direction, in the half of the thin-film disks having a substantial fraction thereof being crossed by the corresponding word line. The current directions shown in FIG. 2 lead to magnetic fields represented there by closed dotted lines ellipses with arrow heads shown along those dotted lines to indicate field direction. An estimate of the field strength at stack 6 due to such a current I in these word lines for the word lines having a width of W and a separation from that stack of d on a center-to-center basis is given by $I\tan^{-1}[(W/2d)/(0.08\pi W)]$. Any sense line currents flow from top to bottom, or vice verse, through memory cells 5 as indicated above thereby generating corresponding circular magnetic fields in the planes of the film layers provided in the cell stacks.

The toroidal shaped memory cells resulting from such stacked thin-films therein forces magnetizations in the magnetic materials of those films to follow circular paths thereby enabling stable flux path closure within the cells. The combination of radial magnetic fields generated by word line currents and the circular magnetic fields generated by sense line currents produces very robust and repeatable switching of the magnetization in stack 6 of memory cell 5 in opposite circular directions following the cell toroidal walls.

The hard magnetic material layers in thin-film layer stack 6 of cell 5 can be switched in magnetization direction together for a relatively large externally applied magnitude magnetic field (along with the other magnetic layers, that is, the soft layers) and the soft magnetic material layers can be switched together for a relatively small externally applied magnetic field (without also switching the hard layers). A memory state is stored in stack 6 of cell 5 as the magnetic materials magnetization directed in one of two opposite circular directions around the center opening in the hard magnetic material layers therein. The soft magnetic material layers in the stack serve for providing the capability to perform an "interrogating" function in the detecting of which of the circular directions in the cell walls the magnetization of the hard layers is currently oriented.

Thus, to retrieve a current memory state of stack 6 of cell 5, two sequential current pulses with opposite polarities can be applied to cell sense line 7 along which that cell is positioned with there also being applied a word line current through the word line adjacent to that cell with a magnitude chosen to be at the state retrieval value. The magnitude of the current pulses is such that only the one of cells 5 having an adjacent word line with current therethrough can have its soft magnetic material layers switched in magnetization circular direction. The occurrence of such a switching of the soft magnetic material layers in magnetization direction for one of these current pulses, with the hard magnetic material layers retaining their current magnetization direction, will change the resistance through the chosen cell 5 to currents in the corresponding sense line 7 thereby signaling the cell magnetic state or memory state.

As stated and described above, operating magnetic fields imposed externally through establishing electrical currents in nearby conductors, or even in the cells themselves, can be used to vary the angle of the magnetic materials magnetization vector with respect to the easy axis, or magnetically unperturbed axis, in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have relatively uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents near by or through sequences of such cells, or both, thereby giving rise to such magnetic fields so that selection of a cell occurs through coincident presences of such fields at that cell.

In such a coincident current selection arrangement, only that cell in the vicinity of the crossing location, or intersection, of these paths (one over a sequence of cells and another through another sequence of cells, and perhaps yet another below a further sequence of cells) experience sufficient magnetic field intensities due to the summing of the fields there, arising because of these coincident currents, to cause such a magnetic state change therein. Cells in the array that are located far away from these current paths are not significantly affected by the magnetic fields generated by such currents in the paths because such fields diminish in intensity with distance from the source thereof. Cells, however, located in relatively close proximity to one, but not two or three, of these paths do experience more significant magnetic fields thereabout, and those immediately in or adjacent to such a path experience sufficient field intensities to be considered as being "half-selected" in two path arrangements (or a "third-selected" in three path arrangements as described above for memory cells 5) by the presence of current in that path intended to participate in fully selecting a different cell along that path at the intersection with the other path or paths on which a selection current is also present. Half-selection or third-selection means that a bit is affected by magnetic fields from the current through the one path but not by those coincident currents present on another path or paths. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

As such magnetic thin-film memory cells are made smaller to thereby increase the cell density over the surface of the substrate on which they are disposed, the resulting cells become more subject to magnetic state, or data, upsets due to thermal fluctuations occurring in the materials therein. The depth of the energy well in the magnetic material of such cells can be approximated as $H_{weff}*M_s*$Volume, where $H_{weff}$ is half the effective restoration magnetic field attempting to maintain the current magnetic state following perturbations thereto and so effectively providing the energy well depth, $M_s$ is the saturation magnetization of the magnetic material in the cell, and Volume is the volume of the magnetic material in the cell. In conventional cells, $H_{weff}$ is provided by shape anisotropy or anisotropy due to the material properties of the cell magnetic material, or both. Typically, the value of $H_{weff}$ in these cells is less than 100 Oe.

Toroidal stacks 6 in memory cells 5 described above, in having orthogonal word line sets positioned on opposite sides thereof, have a further cell magnetic state upset possibility if electrical current is established in only one of these sets of word lines in a third-select situation. In such occurrences as part of fully selecting some other cell, the third-select cells do not have a full radial magnetic field established thereabout. The field that is established thereabout has much less symmetry and this can result in forming unwanted domain walls in the magnetic materials in such third-select cells during such occurrences which leads to "magnetic noise" and the possibility of erroneous state information being obtained form the cell.

In addition to risking such upsets, the use of two orthogonally positioned sets of word lines in addition to sense lines requires that a switch or multiplexer be used with a second word line set current supply in conjunction with the current supply for operating the first word line set, and perhaps in conjunction with the sense lines, as a cell selection is made through supplying currents to the orthogonally positioned word lines adjacent thereto and possibly also the corresponding sense line. Thus, there is a desire for a cell selection arrangement with reduced upset risks, reduced operating circuitry and reduced operating currents which otherwise cause additional unwanted device heating.

BRIEF SUMMARY OF THE INVENTION

The present invention provides a ferromagnetic thin-film based array of directed magnetic field generating structures having a plurality of toroidally shaped layer stacks each with a pair of ferromagnetic material layers separated by an intermediate layer of nonmagnetic material each electrically connected to one of a plurality of pairs of contact line structures each having as members a first contact line structure electrically connected to one of the pair of ferromagnetic material layers in a corresponding one of the plurality of toroidally shaped layer stacks and a second contact line structure electrically connected to that remaining one of the pair of ferromagnetic material layers in that corresponding one of said plurality of toroidally shaped layer stacks so that extension portions of the first and second contact line structures in each of said plurality of pairs of contact line structures each extend outside that pair of ferromagnetic material layers electrically contacted thereby away from that corresponding one of the plurality of toroidally shaped layer stacks in a corresponding selected extension direction.

In addition, an extended, substantially parallel initial pair of electrical conductor branches is positioned across an electrically insulative layer from one of the pair of ferromagnetic material layers in each of the plurality of toroidally shaped layer stacks as electrically connected by the corresponding pair of contact line structures. This initial pair of electrical conductor branches has pairs of adjacent coupling portions thereof that are nearer a corresponding one of said plurality of toroidally shaped layer stacks than are other portions of the initial pair of electrical conductor branches with each pair of adjacent coupling portions extending in directions perpendicular to an orientation direction through its corresponding said toroidally shaped layer stack that is positioned at a selected positioning angle with respect to an extension direction associated with that one of the plurality of pairs of contact line structures electrically connected thereto. The initial pair of electrical conductor branches further has pairs of adjacent connecting portions thereof located between neighboring ones of the pairs of adjacent coupling portions thereof with these pairs of adjacent connecting portions extending in a direction differing from all of the directions in which those pairs of adjacent coupling portions on either side thereof extend. The initial pair of electrical conductor branches are in direct electrical contact with one another to together form a first side electrical conductor.

A further addition comprises an extended substantially parallel subsequent pair of electrical conductor branches positioned across an electrically insulative layer from that one of the pair of ferromagnetic material layers in each of the plurality of toroidally shaped layer stacks that is opposite to that one thereof across from the first side electrical conductor as these toroidally shaped layer stacks are electrically connected by a corresponding pair of contact line structures. This subsequent pair of electrical conductor branches has pairs of adjacent coupling portions such that each of the pairs of adjacent coupling portions is nearer a corresponding one of the plurality of toroidally shaped layer stacks than are other portions of the subsequent pair of electrical conductor branches with each pair of adjacent coupling portions extending in directions perpendicular to a direction through its corresponding toroidally shaped layer stack that is positioned at a selected angle with respect to an extension direction associated with that one of the plurality of pairs of contact line structures electrically connected thereto. The subsequent pair of electrical conductor branches further has pairs of adjacent connecting portions located between neighboring ones of the pairs of adjacent coupling portions with the pairs of adjacent connecting portions extending in a direction differing from all of the directions in which those pairs of adjacent coupling portions on either side thereof extend. Also, the subsequent pair of electrical conductor branches are in direct electrical contact with one another to together form a second side electrical conductor. The first and second side electrical conductors can also be electrically joined to form an array electrical conductor.

DETAILED DESCRIPTION

True two dimensional memory cell selection from an array of toroidal shaped memory cells 5 for the purpose of storing data in, or retrieving data from, selected ones of those cells means being able to do such a selection without having to provide current through more than one word line at a cell being selected therefor, in addition to providing the sense line current also established at that cell in implementing the selection. Such selection can be provided through use of an appropriately configured single word lines each extending along a corresponding sequence of such cells positioned in either a row or a column of the array with the sense lines forming the columns or rows, respectively.

Figure 3:
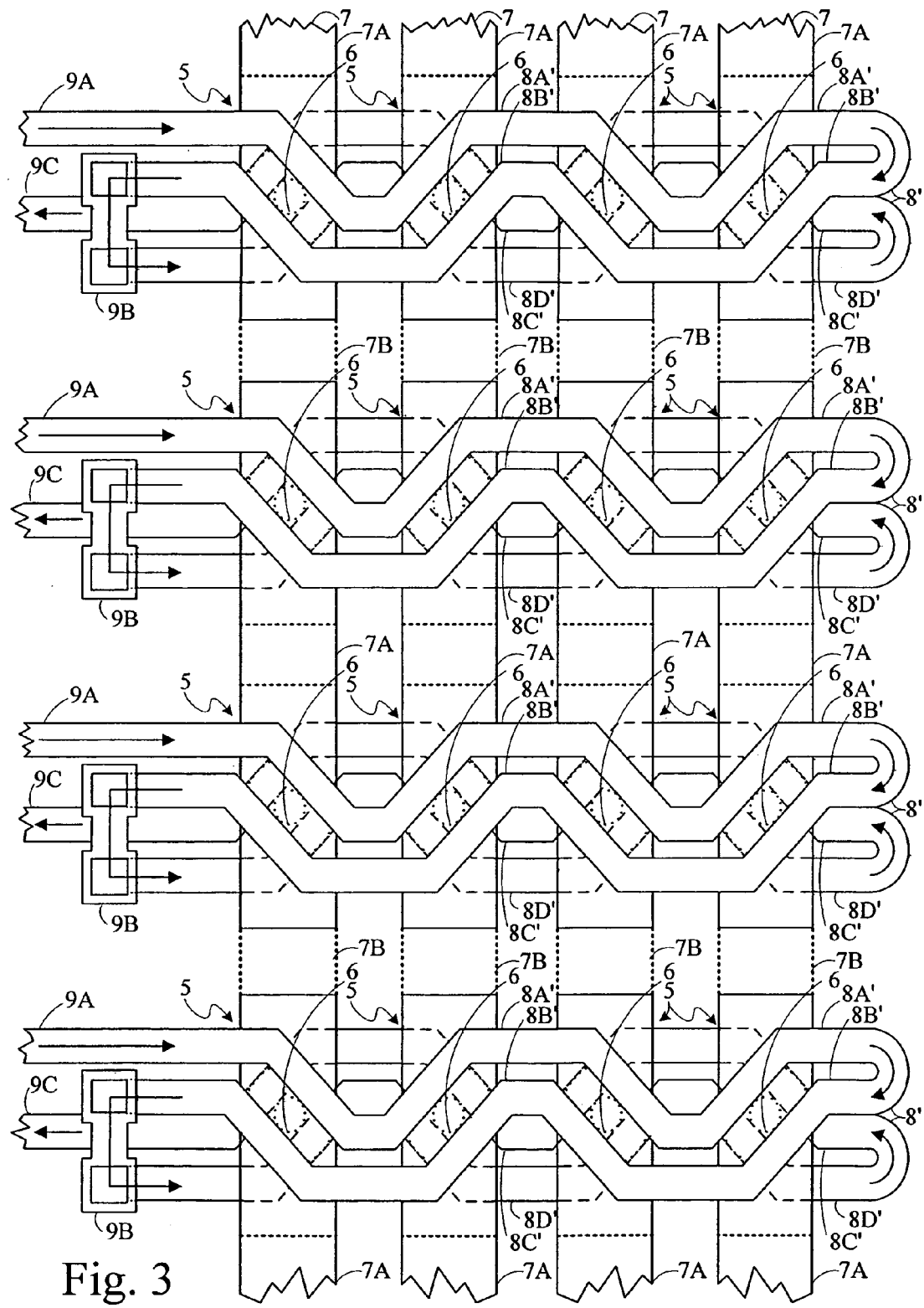
FIG. 3 shows a top fragmentary view of a portion of a monolithic integrated circuit chip embodying the present invention in which there is provided an array of memory cells.

Such an arrangement is provided in a four toroidal cell by four toroidal cell memory cell array example seen in the top view of a portion of a monolithic integrated circuit shown in FIG. 3. Typically, in practice, such memory cell arrays would frequently be an array with a much greater number of memory cells therein. Stacks 6 in FIG. 3 are like those described above in the preceding figures.

The optional protective layer that is provided over the structure shown in these figures in actual use has been omitted in this view for clarity as have some other layers so that the structure portions are shown in solid line form except for structure portions beneath other structure portions appearing in those figures which are shown in dashed line form though these dashed lines are not always shown in such circumstances. A further exception is that some other structures have been indicated in outline only by further alternative dashed lines forms again for clarity to avoid having these structures cover over other underlying structures.

Figure 1:
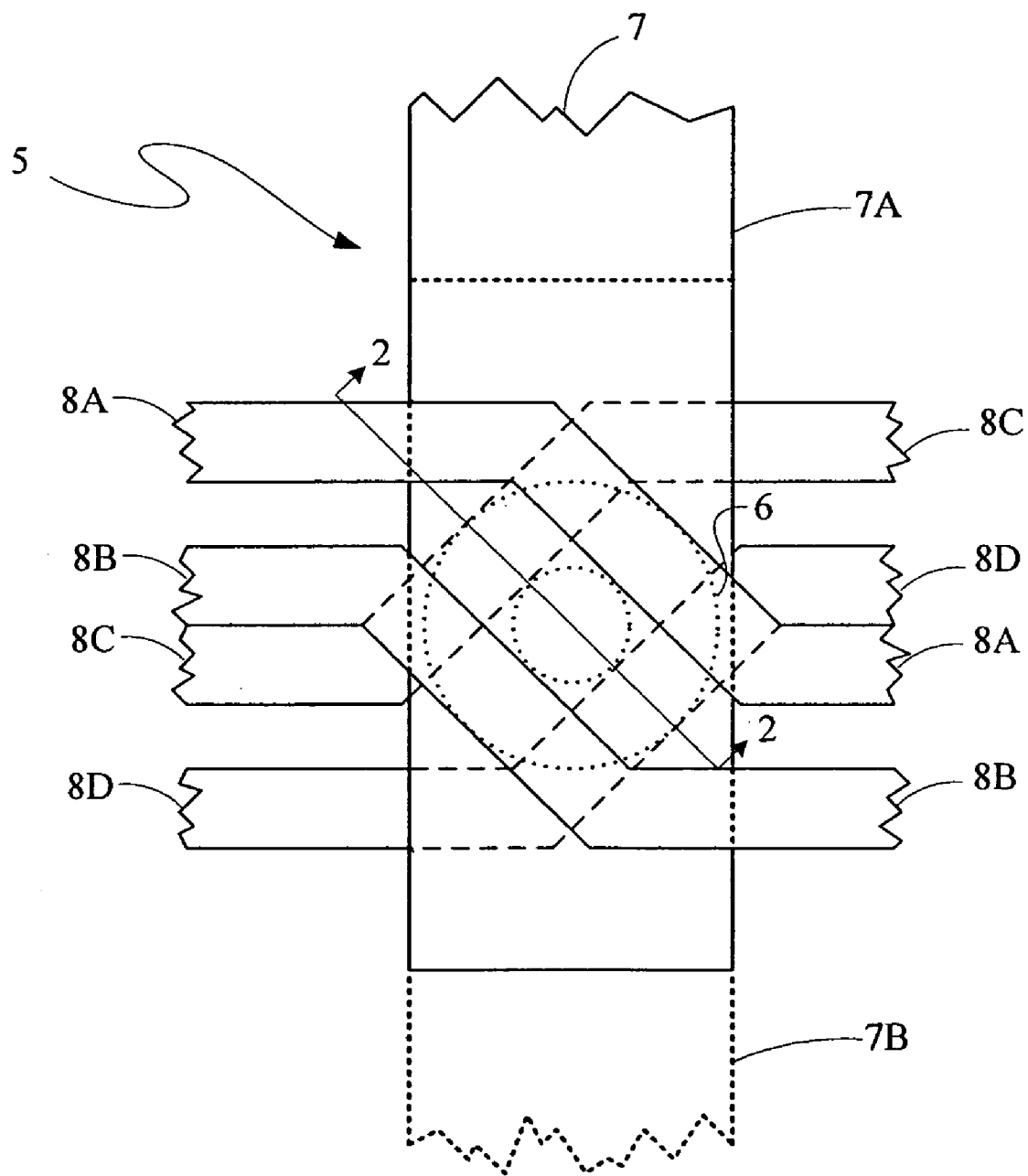
FIG. 1 shows a top fragmentary view of a portion of a monolithic integrated circuit chip in which there is provided a memory cell.
Figure 2:
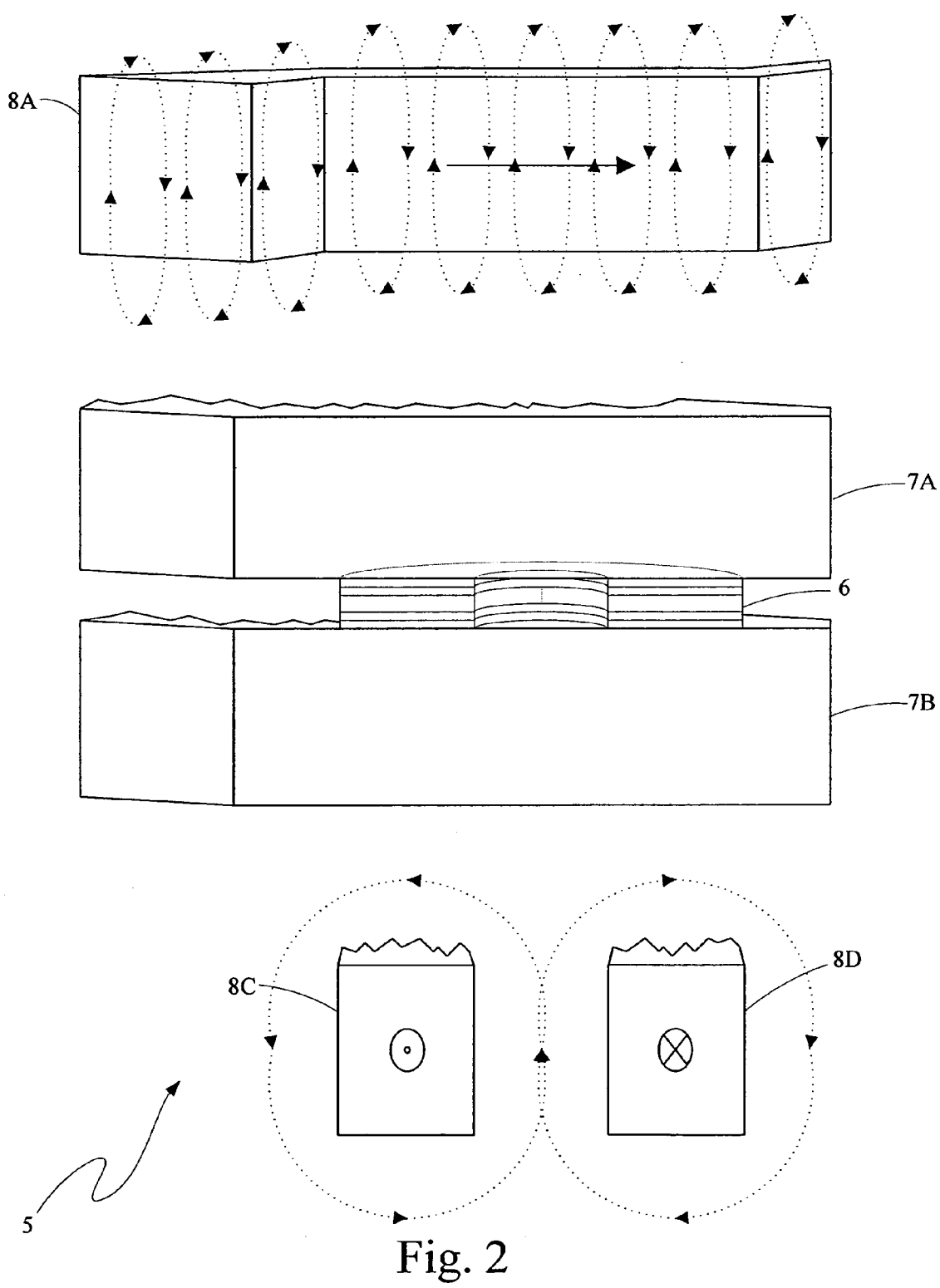
FIG. 2 shows a layer diagram of a representation of the memory cell of FIG. 1.

In the array of FIG. 3, sense lines 7 are configured as described above with adjacent cell pairs interconnected top electrode to bottom electrode, and the overlapping subsequent pair formed by adding the next cell to the last cell in the previous pair is interconnected bottom to bottom, this pattern being repeated a selected number of times to complete a sense line 7. Sense lines 7 so configured extend along the array columns in FIG. 3 for joining at the ends of each with suitable information storage and retrieval circuitry, and with the more intricately structured word lines, 8', extending back and forth above and along the rows of that array in a direction generally orthogonal to sense lines 7, and then again extending back and forth below and along the same rows of that array again generally orthogonal to sense lines 7. Word lines 8' are each together formed of four portions, 8A', 8B', 8C' and 8D', that, for those parts thereof sufficiently near a stack 6, either have the same relationship with that stack as shown in FIG. 1 or a rotated relationship resulting from a 180° rotation about the vertical axis of symmetry. Word line portions 8A' and 8B' are in the upper word line portion of a word line 8' and word line portions 8C' and 8D' are in the lower word line portion thereof.

Each word line conductor 8' is shown initially starting with a first portion thereof positioned above the array of memory cell stacks in a direction extending into and out of the plane of the figure, and further initially starting from an input, 9A, on the left upper side in the plane of the figure of a corresponding row of toroidal memory cell stacks 6 which will be connected to suitable information storage and retrieval circuitry. Each word line in this upper portion thereof then extends from this input in the plane of the figure in a direction parallel to the direction of extent of that row of memory cell stacks until just prior to reaching a vertical axis through the center of the first toroidal stack in the row. There the word line angles 45° downward to extend past the center opening of that first toroidal stack to a point just past the first toroidal stack where it angles upward 45° to again extend parallel the direction of extent of that row of memory cell stacks. Extending from there to just short of reaching the second toroidal stack in the row thereof, the word line conductor at that point angles 45° upward to extend past the center opening of that second toroidal stack to a point just past the second toroidal stack where it angles downward 45° to again extend parallel to the direction of extent of that row of memory cell stacks, and to also be aligned in its extent there with that portion of the word line initially extending from the input thereof.

This pattern is then repeated over the remaining pair of memory cell stacks 6 in the row (or pairs in a larger array) to the right end of that row where the word line extends further by following a semicircle to thereby reverse direction in its further extent to result in again paralleling the direction of extent of that row of memory cell stacks, but in the opposite direction. This extent of the word line conductor past the point of completion of the semicircle is at a position just a bit on the upper side of the center of the last memory cell stack in the row thereof.

From this position, the word line conductor extends almost to the last memory cell stack in the row thereof from the end of the semicircle at which point the word line conductor angles 45° downward to extend past the center opening of this last memory cell stack in the row thereof to a point just past this last memory cell stack in the row thereof. The word line conductor at this point angles upward 45° to again extend parallel to the direction of extent of that row of memory cell stacks at a position that is just as far down on the lower side of that row in the plane of the figure as the initial extent of that word line from the input thereof was above the upper side of that row in the plane of the figure. From that point the word line conductor extends along the remaining next pair of memory cell stacks in the row thereof (or remaining pairs thereof in an larger array) to a stack short of the beginning of that row just as it extended initially from the input of the row but (a) positioned on the lower side of the row in the plane of the figure, and (b) angling 45° always in the opposite direction at each angle change location to the angle changes at the corresponding angle change locations in the word line extent from the input thereto, until the word line is just short of reaching the first memory cell stack at the left end of the row.

There, the word line conductor angles 45° upward to extend past the center opening of the first memory cell stack to a point just past that stack where it angles 45° downward to extend past the first cell parallel to the direction of extent of the row to reach a point near to the input of that word line on the right of the array. At that point the word line conductor angles 90° downward in the plane of the figure to reach a via location at which an interconnection, 9B, is formed extending into the structure supporting the upper word line portion, that is, into the plane of the figure, from this upper word line portion just described. This via interconnection extends through this supporting structure including the support for memory cell stacks 6 to reach the remaining lower portion of the word line positioned below the same row of memory cell stacks in the direction extending in and out of the plane of the figure.

Thus, these upper portions of the word lines just described are each formed in the plane of the conductor above the corresponding row of memory cell stacks 6 as a modified "U" shaped conductor having a pair of "legs" with separated ends at one end of this shape and with opposite ends joined with a semicircular conductor portion, these "legs" being modified to parallel one another in each following a modified zigzag shaped extent with flattened direction changing locations so that at each such location there are two 45° angle changes rather than a single 90° angle change there as in the more usual uniform zigzag path. (Such a 90° single angle path change could be used at each path direction change location as could more than two path angle changes there, or even a continuous curved path angle change could be used.) The remaining diagonal portions of the modified zigzag "legs" are positioned over the memory cell stacks with the stack center openings being exposed by the separations between these modified "legs".

The lower portions of word lines 8' are essentially like that of the upper portions thereof. In the view shown in FIG. 3, the lower portions are like the corresponding upper portion positioned in the lower portion plane below memory cell stacks 6 in the direction in and out of the plane of the figure but rotated about an axis therethrough parallel to the axis joining the centers of stacks center openings. Via interconnections 9B to the lower portions of word lines 8' thus occurs at point therein corresponding to input 9A of the corresponding upper portion. That remaining end of each of the lower portions as a result becomes an output, 9C, of the corresponding word line which again will be connected to suitable information storage and retrieval circuitry. Thus, all of the memory cell stacks 6 adjacent to a corresponding word line 8' are subjected to a full half select substantially radial magnetic field for desired operations if an electrical current is established in that word line.

Thin-film stacks 6 interconnected by sense lines 7 are separated in the monolithic integrated circuit structure in FIG. 3 from upper word lines portions 8A' and 8B' and lower word lines portions 8C' and 8D' by layers of dielectric material which also surrounds the otherwise exposed portions of these stacks and sense line interconnections. The array in FIG. 3 can be alternatively operated as an external magnetic field sensor with word lines 8' then chosen to serve alternatively as a bias radial magnetic field source for the stacks, or as part of a feedback loop with those stacks, or as operating radial magnetic field generators.

Figure 4:
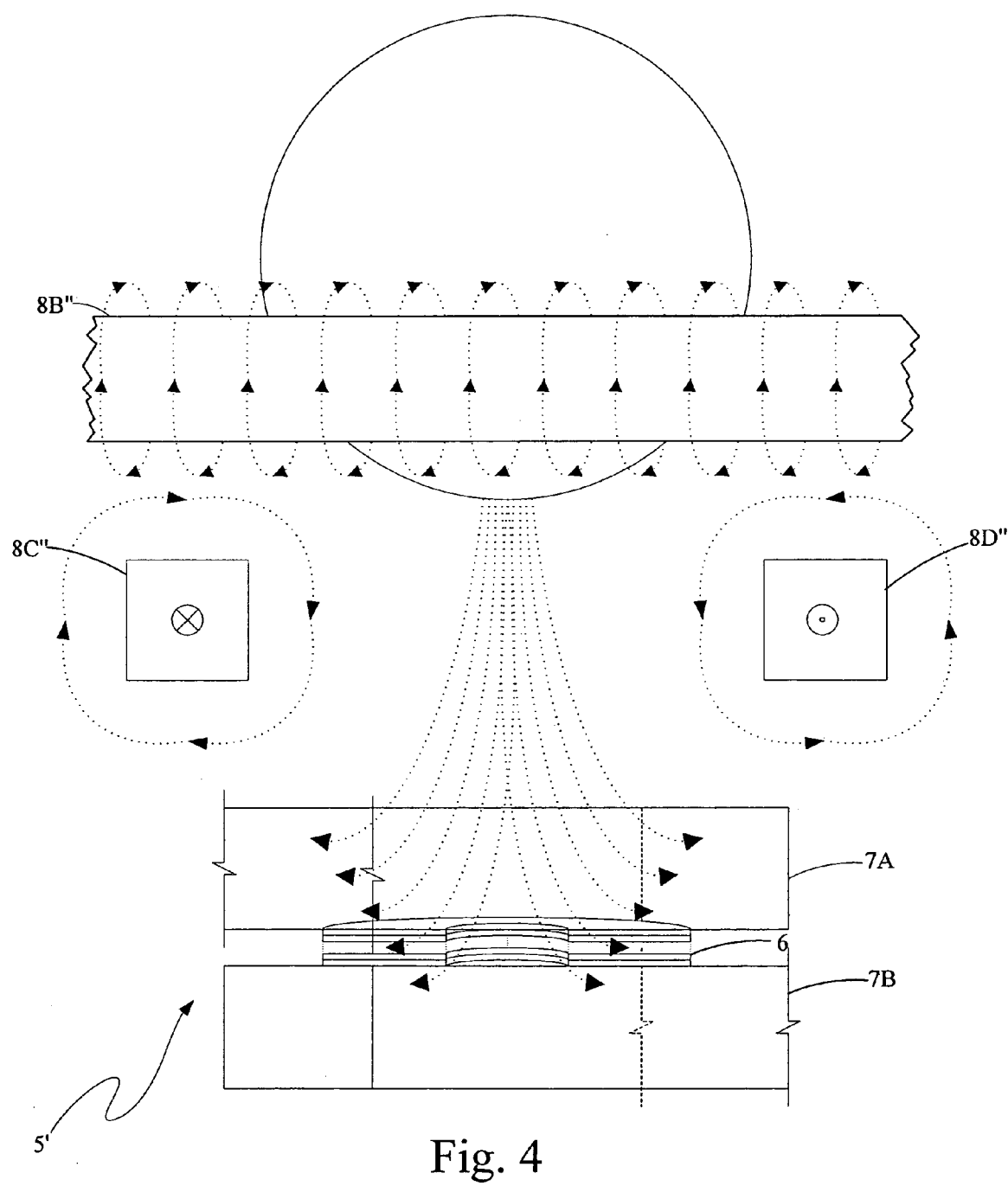
FIG. 4 shows a layer diagram of a representation of a sensor in a modified version of the memory cell shown in FIG. 3.

In sensing situations in which the presence of very small magnetic material particles, or nanoparticles, are to be sensed which requires that such particles also be magnetized as part of such sensing, the entirety of word lines 8' can be provided on one side of sense lines 7 resulting in stacks 6 being separated therefrom by a single, optimally thin, layer of dielectric, and further allowing the word lines to be positioned about the region where such nanoparticles are desired to be captured for the sensing thereof. Such an arrangement is shown in a schematic representation of an individual sensor, 5', in FIG. 4 in which the spherical shape shown there represents a nanoparticle. The word line portions shown have been designated 8A", 8C" and 8D" to indicate the changes therein in relative position between the upper and lower portions thereof, and between them and stack 6, along with the greater spacing therebetween provided to offer a region for the capture of nanoparticles for sensing.

Returning to the structure of FIG. 3, the optimal ratio of inner diameter to outer diameter of toroidal stacks 6 is 1:3, that is, the inner diameter is the same as the width of the annular ring forming the toroid. Such a ratio assures that the annular ring is sufficiently wide so that shape anisotropy does not raise the magnetization switching threshold too large but not so wide as to lead the formation of unwanted domain walls in the magnetic materials in the toroid.

This ratio choice affects the spacing chosen between two legs of both the upper and the lower portions of the word lines which is ideally equal to or less than the inner diameter of the toroid bit, and the also the width of such a leg, as this is ideally equal to or greater than the width of the annular ring. Such choices assure that the distribution of the radial fields generated by electrical currents in the word lines is sufficient to encompass all of the toroidal stack in each cell where the upper and lower portions of the word lines cross one another without being so close together as to risk being electrically short circuited to one another during fabrication. Thus, the ratio of spacing between word line legs to the edge-to-edge width of the two word lines is less than or equal to 1:3, and the ratio of word line spacing to word line leg width is less than or equal to 1:1.

Spacing between the upper and lower portions of the word lines and stacks 6 is dependent on sense lines 7 metal interconnections and dielectric thickness. Optimally, to keep the sense line resistance minimized, the sense line metal is maximized and dielectric is minimized for a given total interlayer spacing specification. Total spacing should be equal to or less than 3000 Å. The shape of the word line legs cross section should be rectangular with a ratio of depth to width greater than or equal to 1:1.

The minimum limit of the inner diameter of the toroid stacks 6, that is, the diameter of the opening therein, is approximately 10 nm as is required to keep a circular magnetization in the toroid energetically more favorable than some linear magnetization result in the toroid. The minimum memory cell 5 area is $16\lambda^2$, where $\lambda$ is the minimum inner diameter of the toroid stack. Therefore, the minimum bit size is 0.0016 $\mu m^2$ and the maximum bit density is 400 Gbits/$in^2$. This is an upper limit since process tolerances for sense line interconnection metal and word lines will increase the overall cell size. In this structure, a 10 mA word line current decreases stack circular magnetization direction switching thresholds by roughly one-half.

In operation, when electrical currents are established in any of toroidal stacks 6 in cells 5 by supplying such currents to the corresponding one of sense lines 7, corresponding circular magnetic fields arising from such currents are generated within that stack. Such currents exceeding a certain value (soft layer switching threshold) will reverse any opposed direction circular magnetizations of, first, the soft layer or layers thereof, and then, for any such currents exceeding a larger certain value (hard layer switching threshold), will reverse any opposed direction circular magnetization of the hard layer or layers also. If the magnetization direction is maintained, or reversed, of the soft layer or layers to be antiparallel to that of the hard layer or layers, the corresponding cell 5 will be in a maximum cell resistance magnetic state between sense line interconnections thereto. The minimum resistance cell magnetic state is the opposite situation in which the circular magnetization directions of the soft and hard layers in cells 5 are parallel to one another.

When additional magnetic fields, sometimes referred to as torque fields, are applied to stacks 6 through establishing electrical currents in the corresponding ones of word lines 8', the soft and hard layers switching thresholds are effectively reduced. These torque fields approximate magnetic radial fields, either positive or negative depending on current directions in the word lines, such that these fields are directed substantially perpendicular to the sides of the annular rings forming the toroids. If the annular rings of toroidal stacks 6 are sufficiently narrow, the switching of magnetization directions therein is ideally single domain and such cells behave as memory cells. If the annular rings are relatively wide such that the switching of magnetization directions therein is sufficiently gradual, then stacks 6 can serve as magnetic field sensors for the detection of localized magnetic fields such as those generated by magnetized nanoparticles. In this situation the radial fields in stacks 6 can be utilized as bias fields for the sensor, or to magnetize the nanoparticle as indicated above.

As indicated, electrical currents established in word lines 8' generate radial magnetic fields oriented approximately radially, and positively or negatively according to the directions of such currents. That is, the radial fields can be directed outward with respect to the toroid axis of circular symmetry or inwards toward that axis. Via connection 9B between lower word line portions and upper word line portions must be arranged such that these upper and lower portions both generate portions the approximating radial field contributing to the same resulting radial field direction, either outward or inward.

Turning to fabrication of these structures, the starting substrate can be a native silicon chip or wafer or can be comprised of semiconductor material based monolithic integrated circuit chips or wafers having an outer insulating layer thereon. In memory arrays, lower word line portions are formed on the starting substrate using a Damascene interconnections process to result in a flat outer surface including the outer lower word lines surfaces. Use of a substrate with integrated circuits formed therein allows these lower word line portions to be interconnected directly with the integrated circuitry in the substrate through metal contact plugs in vias through the outer insulating layer provided. Subsequent layers of dielectric material, toroid stack materials and sense line interconnection metal are then deposited and patterned using well known processes.

Figure 5:
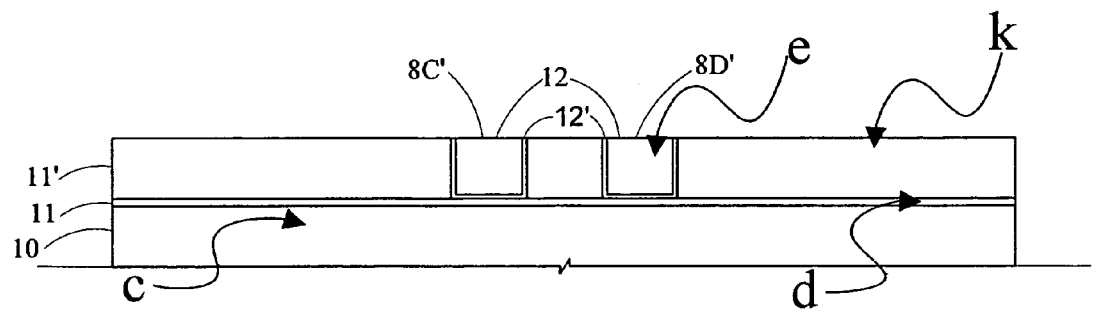
FIG. 5 shows a layer diagram of a portion of a structure intermediate to that of a memory cell shown in FIG. 3, and FIGS. 6A, 6B and 6C show layer diagrams of different portions of a memory cell shown in FIG. 3.

FIG. 5 shows a layer diagram of a portion of a monolithic integrated circuit chip or wafer at an intermediate point in the fabrication process in which lower word lines portions have been provided by a Damascene process. This structure has a planarized insulating material layer, 10, of silicon nitride, aluminum oxide or other dielectric material as the substrate which is only the outer electrical insulating layer provided in a monolithic integrated circuit portion of the chip provided below but not otherwise shown. An aluminum nitride etch stop layer, 11, approximately 600 Å thick is provided on this substrate 10. A silicon nitride dielectric and trench layer, 11', approximately 2500 Å thick is provided on this etch stop layer with reactive ion etched trenches formed therein using that etch stop layer that are equal to or greater in width than the width of the annular ring in toroid stacks 6. A spacer region is left after the etching between the legs of the lower word line portion that is equal to or less than the diameter of the center openings in toroid stacks 6, this spacer region to have the center openings in toroid stacks 6 positioned directly thereover on completion of those stacks.

These trenches are shown containing word line portions formed by having therein copper, 12, that has been subsequently plated onto a thin layer of ferromagnetic material, 12', previously provided on the surfaces of those trenches for the purpose of having that ferromagnetic material clad that later provided copper. This cladding, though optional, does concentrate the magnetic fields generated by electrical currents in the word lines by a factor of two or more. The result is the provision of a lower word line portion comprising word line portions 8C' and 8D'.

The upper word line portions are then provided using either a Damascene process or metal photolithography and etching process. Interconnections from upper word line portions to corresponding lower word line portions is achieved using a dual-Damascene via process during the forming of the upper word lines, or alternatively using a double-via metal bridge after the upper word line portion is completed and capped with an appropriate dielectric. This fabrication approach is also used if the system is to be used as a localized field sensor, wherein the word lines are employed as bias magnetic field or operating magnetic field generators.

In the sensing of nanoparticles, including the magnetization thereof for this purpose, both the lower and upper word line portions are fabricated after a thin layer of dielectric material is provided over the deposited and patterned materials for the toroidal stacks and the sense lines metal interconnects which are first completed to provide the electrically insulating separation therebetween. A recess can be etched into the exposed surface of the outer passivation electrical insulating material provided over the upper word line portions after the completion thereof that is positioned within the square area defined by projecting the edge boundaries of the crossing word lines onto this outer surface to provide a physical capture location to hold a nanoparticle at a minimized distance to the toroid stacks. In this circumstance, the word lines can be positioned outside the outer diameter of the toroid stack magnetic field sensor so that the generated magnetic field reaches the nanoparticle in the recess but has much less effect on the toroid stack sensor. Alternatively, the word lines can be positioned as described above across from the toroid stack annular ring to be used in that configuration to both magnetize the nanoparticle and magnetically bias the toroid stack sensor.

Figure 6A:
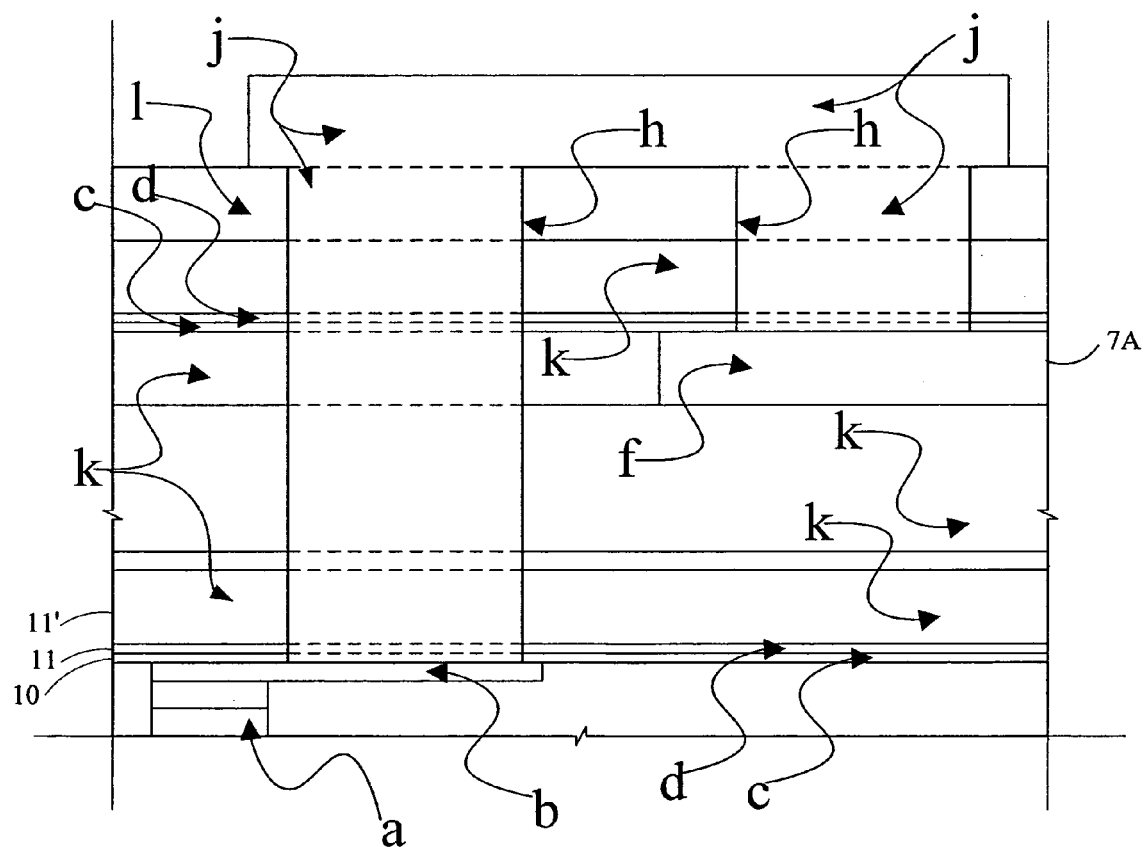
Figure 6B:
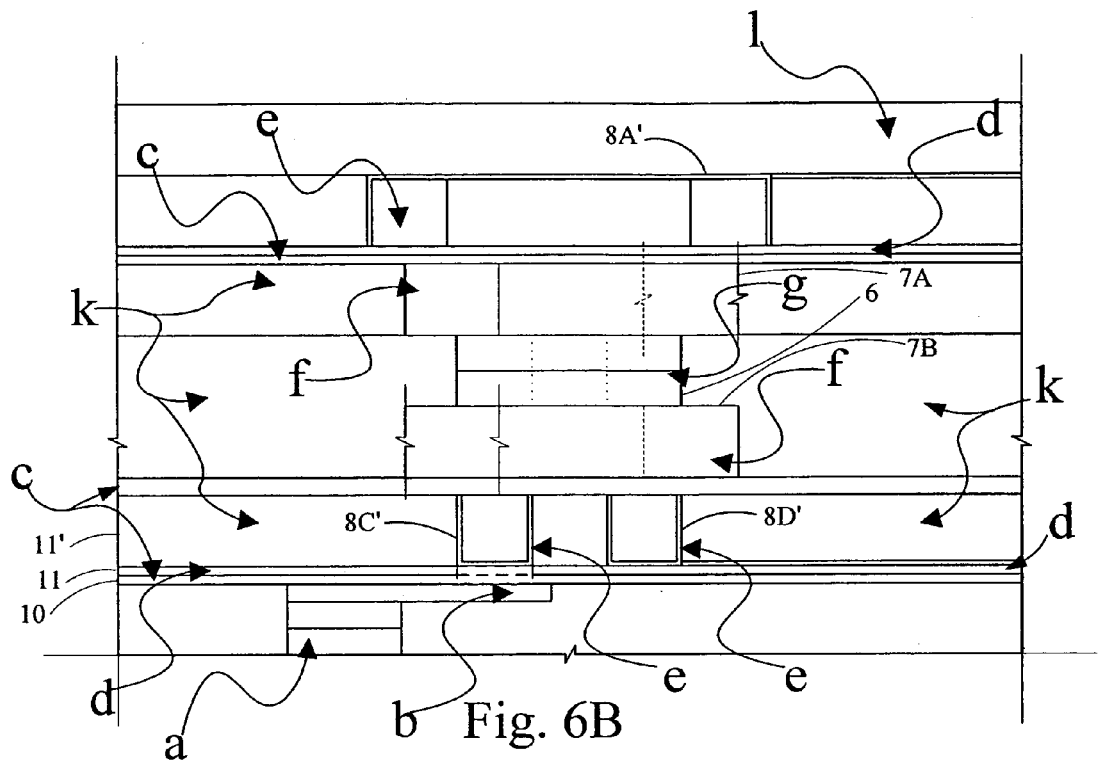
Figure 6C:
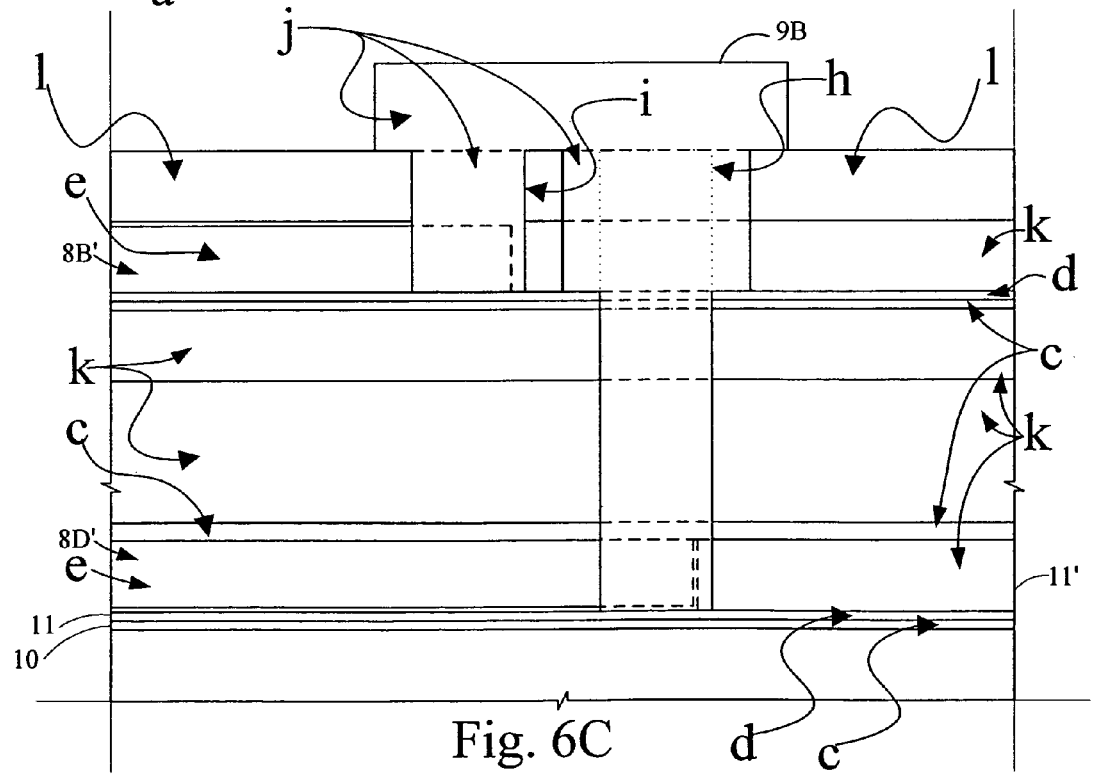

FIGS. 6A, 6B and 6C show layer diagrams of three views of a monolithic integrated circuit chip or wafer in which there is provided a memory cell 5 from FIG. 3. FIG. 6A shows a sense line interconnection 7A being interconnected with integrated circuitry in the substrate. FIG. 6B shows a toroidally shaped cell stack 6 interconnected between sense line interconnects 7A and 7B, and further shows the associated upper and lower word line portions 8A', 8B' and 8D' along with an interconnection of lower word line portion 8C' to integrated circuitry in the substrate. Finally, FIG. 6C shows upper word line portion 8B' being interconnected to lower word line portion 8D' through metal via interconnection 9B. These layer diagrams give an indication of the structural layers leading to the structures shown in FIG. 3 but are not true cross-section views in that many dimensions are exaggerated or reduced for purposes of clarity.

The device layers shown in FIGS. 6A, 6B and 6C comprise substrate integrated circuitry riser (a) and contact plug (b) rising through the monolithic integrated circuit structure portion (not otherwise shown) to reach openings in electrical insulating substrate 10 to electrically connect the information storage and retrieval integrated circuitry below in that integrated circuit structure portion to the memory structure later formed thereon; planarized dielectric (c) approximately 250 Å to 500 Å thick as layer 10 with openings therein; aluminum nitride etch stop layer (d) approximately 250 Å to 600 Å thick serving as layer 11 having openings therein above those in layer 10; word lines built using copper Damascene processing (e) serving as joined word line portions 8A', 8B', 8C' and 8D' including an interconnection of lower word line portion 8C' to a plug (b); copper sense lines interconnections approximately 2000 Å thick (f) serving as interconnections 7A and 7B; toroidally shaped GMR memory bit stack (g) serving as cell stack 6; first of two contact via cuts (h) to form openings in an insulative layer; second of two contact via cuts (i) to form openings in an insulative layer; copper or aluminum interconnection metal (j) for connecting sense lines to the information storage and retrieval circuitry in the monolithic integrated circuit structure portion and for connecting joined word line portions 8A' and 8B' to that circuitry (these latter connections not being shown in these figures), and also for connecting joined word line portions 8A' and 8B' to joined word line portions 8C' and 8D' serving as interconnection 9B; planarized interlayer silicon nitride dielectric (k) approximately 2500 Å to 3000 Å thick including that serving as layer 11'; and non-planarized silicon nitride dielectric (l).

Although the present invention has been described with reference to preferred embodiments, workers skilled in the art will recognize that changes may be made in form and detail without departing from the spirit and scope of the invention.

The invention claimed is:

1. A ferromagnetic thin-film based array of directed magnetic field generating structures, said array structure comprising:

a plurality of toroidally shaped layer stacks each having a pair of ferromagnetic material layers separated by an intermediate layer of nonmagnetic material;

a plurality of pairs of contact line structures each having as members a first contact line structure therein electrically connected to one of said pair of ferromagnetic material layers in a corresponding one of said plurality of toroidally shaped layer stacks and a second contact line structure therein electrically connected to that remaining one of said pair of ferromagnetic material layers in that corresponding one of said plurality of toroidally shaped layer stacks so that extension portions of said first and second contact line structures in each of said plurality of pairs of contact line structures, extending outside that pair of ferromagnetic material layers electrically contacted thereby, each extend away from that corresponding one of said plurality of toroidally shaped layer stacks in a corresponding selected extension direction;

an extended substantially parallel initial pair of electrical conductor branches positioned across an electrically insulative layer from one of said pair of ferromagnetic material layers in each of said plurality of toroidally shaped layer stacks as electrically connected by a said corresponding pair of contact line structures, said initial pair of electrical conductor branches having pairs of adjacent coupling portions thereof such that each said pair of adjacent coupling portions is nearer a corresponding one of said plurality of toroidally shaped layer stacks than are other portions of said initial pair of electrical conductor branches with each said pair of adjacent coupling portions extending in directions perpendicular to an orientation direction through its corresponding said toroidally shaped layer stack that is positioned at a selected positioning angle with respect to a said extension direction associated with that one of said plurality of pairs of contact line structures electrically connected thereto, said initial pair of electrical conductor branches further having pairs of adjacent connecting portions thereof located between neighboring ones of said pairs of adjacent coupling portions thereof with said pairs of adjacent connecting portions extending in a direction differing from all of said directions in which those said pairs of adjacent coupling portions on either side thereof extend, said initial pair of electrical conductor branches being in direct electrical contact with one another to together form a first side electrical conductor.

2. The device of claim 1 wherein said first and second contact line structures as members of a said pair thereof electrically connected to a corresponding one of said pair of ferromagnetic material layers in a corresponding one of said plurality of toroidally shaped layer stacks extend away therefrom in said corresponding selected extension direction so as to each be commonly formed also as a member of two different ones of said plurality of pairs of contact line structures, respectively, to thereby also be electrically connected to one of said pair of ferromagnetic material layers in each of different adjacent ones of said plurality of toroidally shaped layer stacks.

3. The device of claim 1 wherein said positioning angle between said orientation direction through a said toroidally shaped layer stack and a said extension direction associated with that one of said plurality of pairs of contact line structures electrically connected thereto has a magnitude of 45° in a selected angular direction.

4. The device of claim 1 wherein said a said pair of adjacent connecting portions in said initial pair of electrical conductor branches that is located between neighboring ones of said pairs of adjacent coupling portions also therein extend in a direction perpendicular to a said extension direction associated with a said pair of contact line structures electrically connected to one of said one of said plurality of toroidally shaped layer stacks nearest to one of those neighboring ones of said pairs of adjacent coupling portions.

5. The device of claim 1 wherein said initial pair of electrical conductor branches are in direct electrical contact with one another at an ends thereof opposite an end of at least one thereof which is electrically connected to information storage and retrieval circuitry.

6. The device of claim 1 further comprising an extended substantially parallel subsequent pair of electrical conductor branches positioned across an electrically insulative layer from that one of said pair of ferromagnetic material layers in each of said plurality of toroidally shaped layer stacks that is the same as, or opposite to, that one thereof across from said first side electrical conductor as this said plurality of toroidally shaped layer stacks is electrically connected by a said corresponding pair of contact line structures, said subsequent pair of electrical conductor branches having pairs of adjacent coupling portions thereof such that each said pair of adjacent coupling portions is nearer a corresponding one of said plurality of toroidally shaped layer stacks than are other portions of said subsequent pair of electrical conductor branches with each said pair of adjacent coupling portions extending in directions perpendicular to a direction through its corresponding said toroidally shaped layer stack that is positioned at a selected angle with respect to a said extension direction associated with that one of said plurality of pairs of contact line structures electrically connected thereto, said subsequent pair of electrical conductor branches further having pairs of adjacent connecting portions thereof located between neighboring ones of said pairs of adjacent coupling portions thereof with said pairs of adjacent connecting portions extending in a direction differing from all of said directions in which those said pairs of adjacent coupling portions on either side thereof extend, said subsequent pair of electrical conductor branches being in direct electrical contact with one another to together form a second side electrical conductor.

7. The device of claim 1 wherein there is a corresponding recess in said insulative layer between each of said pairs of adjacent coupling portions of said initial pair of electrical conductor branches across from that one of said plurality of toroidally shaped layer stacks nearest thereto.

8. The device of claim 2 further comprising a contact line structure electrically connected to a corresponding one of said pair of ferromagnetic material layers in a corresponding toroidally shaped layer stack which is also electrically connected to information storage and retrieval circuitry.

9. The device of claim 3 wherein said positioning angle between said orientation direction through an adjacent said toroidally shaped layer stack and a said extension direction associated with that one of said plurality of pairs of contact line structures electrically connected thereto has a magnitude of 45° in an opposite angular direction.

10. The device of claim 4 wherein a said pair of adjacent connecting portions in said initial pair of electrical conductor branches that is located between neighboring ones of said pairs of adjacent coupling portions also therein is on one side of those neighboring ones of said pairs of adjacent coupling portions, and that either further said pair of adjacent connecting portions in said initial pair of electrical conductor branches that are located beyond said neighboring ones of said pairs of adjacent coupling portions are on an opposite side of those neighboring ones of said pairs of adjacent coupling portions.

11. The device of claim 6 wherein said first and second contact line structures as members of a said pair thereof electrically connected to a corresponding one of said pair of ferromagnetic material layers in a corresponding one of said plurality of toroidally shaped layer stacks extend away therefrom in said corresponding selected extension direction so as to each be commonly formed also as a member of two different ones of said plurality of pairs of contact line structures, respectively, to thereby also be electrically connected to one of said pair of ferromagnetic material layers in each of different adjacent ones of said plurality of toroidally shaped layer stacks.

12. The device of claim 6 wherein said positioning angle between said orientation direction through a said toroidally shaped layer stack and a said extension direction associated with that one of said plurality of pairs of contact line structures electrically connected thereto has a magnitude of 45° in a selected angular direction for said pairs of adjacent coupling portions of said initial pair of electrical conductor branches, and wherein said pairs of adjacent coupling portions of said subsequent pair of electrical conductor branches extend parallel to said orientation direction.

13. The device of claim 6 wherein said a said pair of adjacent connecting portions in said initial pair of electrical conductor branches that is located between neighboring ones of said pairs of adjacent coupling portions also therein extend in a direction perpendicular to a said extension direction associated with a said pair of contact line structures electrically connected to one of said one of said plurality of toroidally shaped layer stacks nearest to one of those neighboring ones of said pairs of adjacent coupling portions.

14. The device of claim 6 wherein said initial pair of electrical conductor branches are in direct electrical contact with one another at an ends thereof opposite an end of at least one thereof which is electrically connected to information storage and retrieval circuitry, and wherein said subsequent pair of electrical conductor branches are in direct electrical contact with one another at an ends thereof opposite an end of at least one thereof which is electrically connected to information storage and retrieval circuitry.

15. The device of claim 11 further comprising a contact line structure electrically connected to a corresponding one of said pair of ferromagnetic material layers in a corresponding toroidally shaped layer stack which is also electrically connected to information storage and retrieval circuitry.

16. The device of claim 12 wherein said positioning angle between said orientation direction through an adjacent said toroidally shaped layer stack and a said extension direction associated with that one of said plurality of pairs of contact line structures electrically connected thereto has a magnitude of 45° in an opposite angular direction.

17. The device of claim 13 wherein a said pair of adjacent connecting portions in said initial pair of electrical conductor branches that is located between neighboring ones of said pairs of adjacent coupling portions also therein is on one side of those neighboring ones of said pairs of adjacent coupling portions in said initial pair of electrical conductor branches, and that either further said pair of adjacent connecting portions in said initial pair of electrical conductor branches that are located beyond said neighboring ones of said pairs of adjacent coupling portions in said initial pair of electrical conductor branches are on an opposite side of those neighboring ones of said pairs of adjacent coupling portions, and wherein a said pair of adjacent connecting portions in said subsequent pair of electrical conductor branches that is located between neighboring ones of said pairs of adjacent coupling portions also therein is on one side of those neighboring ones of said pairs of adjacent coupling portions in said subsequent pair of electrical conductor branches, and that either further said pair of adjacent connecting portions in said subsequent pair of electrical conductor branches that are located beyond said neighboring ones of said pairs of adjacent coupling portions in said subsequent pair of electrical conductor branches are on an opposite side of those neighboring ones of said pairs of adjacent coupling portions.

18. The device of claim 14 wherein said first side electrical conductor and said second side electrical conductor are in direct electrical contact with one another at an ends thereof nearest an end of each which is electrically connected to information storage and retrieval circuitry to together form an array electrical conductor.

* * * * *

UNITED STATES PATENT AND TRADEMARK OFFICE
CERTIFICATE OF CORRECTION

PATENT NO. : 7,193,286 B2  Page 1 of 1
APPLICATION NO. : 11/193775
DATED : March 20, 2007
INVENTOR(S) : John M. Anderson et al.

It is certified that error appears in the above-identified patent and that said Letters Patent is hereby corrected as shown below:

Column 15, Line 53, delete "wherein said a said pair",
insert --wherein a said pair--

Column 15, Line 59, delete "to one of said one of said plurality",
insert --to one of said plurality--

Column 15, Line 64, delete "another at an ends thereof",
insert --another at ends thereof--

Column 17, Line 14, delete "wherein said a said pair",
insert --wherein a said pair--

Column 17, Line 20, delete "connected to one of said one of said",
insert --connected to one of said--

Column 17, Line 25, delete "another at an ends thereof",
insert --another at ends thereof--

Column 17, Line 29, delete "another at an ends thereof",
insert --another at ends thereof--

Column 18, Line 33, delete "another at an ends",
insert --another at ends--

Signed and Sealed this

Nineteenth Day of June, 2007

JON W. DUDAS
*Director of the United States Patent and Trademark Office*

UNITED STATES PATENT AND TRADEMARK OFFICE
CERTIFICATE OF CORRECTION

PATENT NO.         : 7,193,286 B2                                              Page 1 of 1
APPLICATION NO. : 11/193775
DATED              : March 20, 2007
INVENTOR(S)        : John M. Anderson et al.

It is certified that error appears in the above-identified patent and that said Letters Patent is hereby corrected as shown below:

Column 1, Line 12, insert the following paragraph between Cross-Reference To Related Application paragraph and Background of the Invention:

--This invention was made with Government support under Contract Number N00025-99-M-0283 awarded by the Office of Naval Research. The Government has certain rights in the invention.--

Signed and Sealed this

Twenty-first Day of October, 2008

JON W. DUDAS
*Director of the United States Patent and Trademark Office*